United States Patent [19]

Redmond

[11] Patent Number: 5,101,171
[45] Date of Patent: Mar. 31, 1992

[54] EXTENDED BANDWIDTH RF AMPLIFIER

[75] Inventor: Kevin Redmond, Palm City, Fla.

[73] Assignee: Advanced Systems Research, Inc., Palm City, Fla.

[21] Appl. No.: 617,348

[22] Filed: Nov. 23, 1990

[51] Int. Cl.⁵ .............................................. H03F 3/68
[52] U.S. Cl. ............................... 330/124 R; 330/53; 330/84; 330/124 D; 330/126
[58] Field of Search .......... 330/53, 84, 124 R, 124 D, 330/126, 295

[56] References Cited

U.S. PATENT DOCUMENTS 4,283,684  8/1981  Satoh ............................ 330/295 X Primary Examiner—James B. Mullins
Attorney, Agent, or Firm—Kevin Redmond

[57] ABSTRACT

A system for extending the frequency range of an RF amplifier by improving the VSWR, and power handling capability of the amplifier, comprising a broadband reversing transformer, a first and a second amplifier coupled by means of a first and a second through-line quadrature coupler with the first quadrature coupler being connected to the inputs of the two amplifiers and the second quadrature coupler being connected to the outputs of the two amplifiers. The broadband reversing transformer is inserted in series with one of the two amplifiers enabling a signal at frequencies out of the passband of the quadrature couplers to pass through the through-lines port of the quadrature couplers, and thereby greatly extending the frequency range over which quadrature couplers may be used while, at the same time, retaining the usual combining and VSWR advantages of the couplers within their passbands.

16 Claims, 8 Drawing Sheets

EXTENDED BANDWIDTH RF AMPLIFIER

BACKGROUND OF THE INVENTION

1. Field of the Invention

The present invention relates to RF amplifiers and more particularly to multi-octave RF power amplifiers.

2. Descriptions of the Prior Art

Broadband RF power amplifiers often use a single transistor in the final amplifier stage. The broadband tuning and the normal drop in RF performance of the transistors at high frequencies result in reduced power output from the amplifier at the high frequency end of the amplifiers operating band.

To increase the power of the amplifiers beyond that of a single transistor, paralleling of transistors stages by means of wide band coupling networks is often employed. Commonly used methods of paralleling do not eliminate the problem in that the power roll off from low to high frequency remains, only at a higher power level than for a single stage. It is difficult in the usual paralleling methods to add in power only at the high frequency end of the band. There are in addition problems with the circuitry commonly used in the usual paralleling methods.

A network which can be used for paralleling transistor amplifier stages is a four-way, in-phase power divider-combiner. This network has the advantage of broadband operation and isolation between the paralleled transistors. Each of the paralleled transistor stages is isolated from the rest to prevent a single stage from accepting all the drive power. This arrangement avoids destruction of transistors which otherwise might occur.

The bandwidth of a four-way divider-combiner can be 1 to 1000 Mhz or greater which is approximately 10 octaves. This is excellent frequency coverage, but there are some drawbacks to this network.

It can only be used to combine four transistors. In many cases, it is only necessary to combine two transistors. It is currently more difficult to produce a high power, two way combiner than it is to produce a four-way combiner. When the power level of a four-way divider-combiner exceeds two to three watts, the price generally increases by a factor of ten because simple ferrite coils can no longer be used to handle the power load. Usually semirigid lines with higher power handling capability must be used. This adds significantly to the cost of an amplifier incorporating such devices. In addition, the VSWR of the transistors stage is, at least in part, reflected in the output of the amplifier. The appearance of the transistor's output impedance at the amplifier's output port is often a problem. It is difficult to present through a matching circuit, an optimum load to the transistor and, at the same time, translate back through the same matching circuit, the output impedance of the transistor to the amplifier output port and have it appear as a standard impedance value of, say, 50 ohms.

There is a coupling device which can combine the output power of two transistors and at the same time help mask the actual impedance of the transistor output stages by presenting a standard output impedance to the output port of the amplifier. This device is the quadrature coupler. Typically, in amplifier employing quadrature couplers, two amplifier stages are placed between two quadrature couplers as shown in FIG. 1A below and, also in U.S. Pat. No. 3,911,372 to Seidel.

Although the quadrature coupler provides the important advantage of masking transistor VSWR, there are a number of practical disadvantages which must be considered. Unfortunately, most low cost quadrature couplers are octave devices, seriuosly limiting the frequency range of the amplifier. Although there are multi-octave quadrature couplers, typically made in stripline, they are usually costly, and large for applications below 500 Mhz, making their use in production amplifiers relatively rare.

It is therefore important to provide an improved system which overcomes both disadvantages of the prior art in that the improved system should function with a low cost octave coupler over multiple octave bands, while retaining the advantage of combining two transistor stages, and presenting a low VSWR over the entire range of the coupler.

SUMMARY

An object of the present invention is to provide an amplifying stage that presents a low VSWR at its input and output ports over a wide frequency range.

An object of the present invention is to provide an amplifying system such as a transistor amplifying system in which a high VSWR presented by the transistors may be masked in order to present a low VSWR at the systems output ports over a selected portion of the system's frequency range.

An object of the present invention is to provide an amplifying system which combines two or more amplifying stages by means of quadrature couplers, and which provide amplification over a frequency range well beyong the bandwidth of the couplers.

An object of the present invention is to provide an amplifying system in which the power handling capability may be enhanced over a selected portion of the system's operating band.

An object of the present invention is to provide an amplifying system which provides a relatively constant output power over the system's entire operating range.

The present invention is an amplifying system which, in one form, comprises two identical through-line, 3 dB, quadrature couplers connected in tandem by means of two identical transmission lines. Identical amplifiers are inserted in series with each transmission line, and, in addition, a 180 degrees phase shifter is inserted in series with one of the transmission lines.

Within the operating frequency range of the coupler this system functions as a quadrature coupled amplifier with all the expected advantage, such as the combined power of both amplifiers and the low VSWR provided by the quadrature couplers. However, this system provides the additional advantage of operation as an amplifier well beyond the frequency range of the coupler, including down to D.C., a feature which permits the addition of high power and improved VSWR at a selected portion of the operating band such as at the high frequency end where it is usually most needed.

DETAILED DESCRIPTION OF THE INVENTION

Figure 1A:
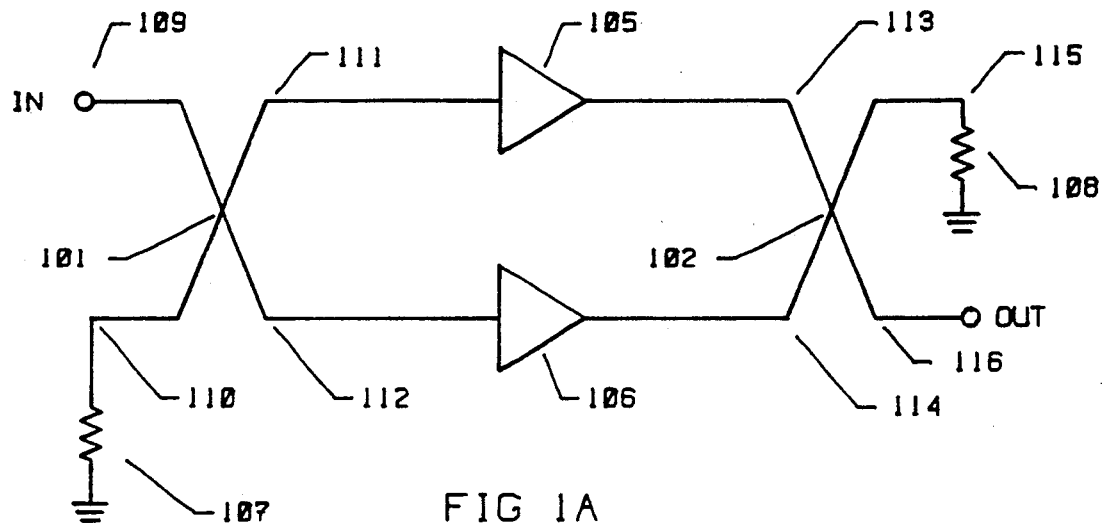
FIG. 1A is a diagram of a prior art quadrature coupled amplifier.

The prior art circuit shown in FIG. 1A can be used as a foundation for understanding the present invention. This prior circuit comprises an input quadrature coupler 101, an output quadrature coupler 102, a first amplifier 105, a second amplifier 106, a first terminating load 107, and a second terminating load 108.

The input coupler 101 includes two input ports 109 and 110 and two output ports 111 and 112. Similarly, the output coupler 102 includes two input ports 113 and 114 and two output ports 115 and 116.

Couplers with various degrees of coupling may be used with the prior art or the present invention; however, three dB quadrature couplers will be used primarily herein to illustrate the prior art and the invention. When other than 3 dB couplers are involved, their use will be clearly noted.

In the normal operation of a three dB quadrature coupler, such as coupler 101, a signal supplied to an input port, such as port 109, is divided equally and delivered to output ports 111 and 112. The two signals emerging from these ports are in quadrature phase relationship with one another.

If output ports 111 and 112 are presented loads with reflection coefficients that are nearly equal in phase and amplitude, such as would be received from identical transistor amplifiers connected to these ports, then ideally, the portions of the two signals reflected by the amplifiers would be combined and delivered to port 110 of the coupler. Port 110, referred to as the isolated port, is connected to a terminating load, such as load 107, which, ideally, absorbs all the reflected signals. When this occurs, the input port 109 appears to have a perfect VSWR of 1:1 because there is no reflected signals returned to this port. These features of quadrature couplers are used with amplifiers to obtain two advantages, an improvement in the input and output VSWR, and an increase in their power handling capability, gained by means of paralleling transistors.

In the prior art circuit of FIG. 1A, the output ports 111 and 112 of coupler 101 are connected to the input ports of amplifiers 105 and 106 respectively. The output ports of amplifiers 105 and 106 are connected to the input ports 113 and 114 of coupler 102, respectively. The isolated ports 110 and 115 of couplers 101 and 102 are connected to terminating loads 107 and 108, respectively.

If the input VSWR of amplifiers 105 and 106 are nearly identical, the input VSWR, as seen at what may be considered the system input port 109, normally will be improved over that of the input VSWR of either amplifier. When the amplifier output reflection coefficients are nearly equal, coupler 102 normally provides a similar improvement in the system output VSWR, as viewed from system output port 116.

Figure 4:
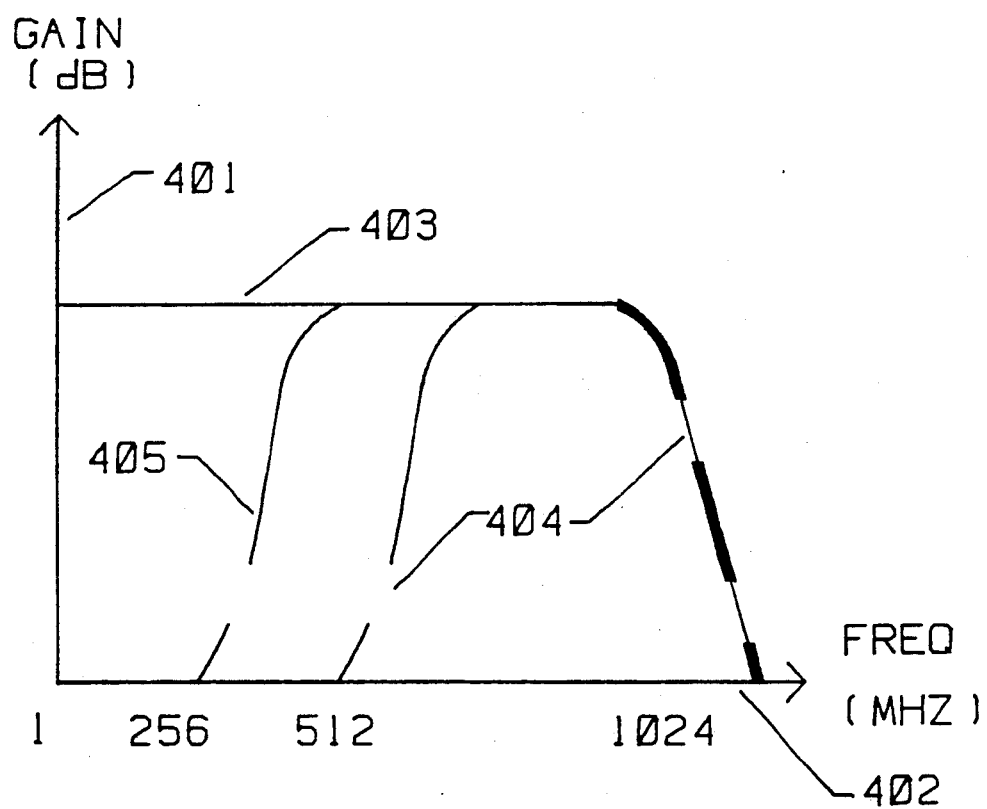
FIG. 4 is a plot of the gain of an amplifier stage as a function of frequency with and without the use of quadrature couplers.

There is, however, a distinct and important disadvantage to the prior art circuit of FIG. 1A that should be considered. The bandwidth of the circuit of FIG. 4 is typically only an octave wide, being limited by the bandwidth of the single octave bandwidth couplers normally used in such circuits. Wider bandwidth couplers are available, but they are relatively large physically and very expensive when compared to a low cost single octave coupler, such as a wire coupler. For example, a printed circuit multi-octave coupler may be 10 times larger and cost 50 to 100 times as musch as a single octave wire coupler, often making the printed circuit coupler prohibitive from both a size and cost stand point.

The single octave coupler severely limits the bandwidth when the bandwidth is considered in terms of octaves. This can be see from FIG. 4. This figure is a plot of the gain-bandwidth capability of an amplifier with and without the use of couplers. In this figure, the ordinate 401 represents gain in decibels, the abscissa 402 represents frequency in megahertz, the solid line plot 403 represents the bandwidth (1 to 1024 Mhz) of an amplifier without the use of couplers, the dotted line plot 404 represents the bandwidth (512 to 1024 mHz) with a single octave coupler, and the dotted line plot 405 represents the bandwidth (256 Mhz to 1024 Mhz) using a double octave coupler. It can be seen from this figure that the amplifier without couplers is capable of a ten octave bandwidth (1 to 1024 mHz), while the single octave coupler is capable of covering only one of these ten octaves.

The present invention completely overcomes the bandwidth limitation of amplifiers incorporating single or multiple octave couplers, while losing none of the advantages normally gained by these couplers within their frequency range. The advantages of the coupler may be shifted within the operating frequency range of the amplifiers, but the couplers are normally centered to cover a frequency range near or exactly at the highest octave range of the amplifiers, thereby increasing the power handling capability of the system at the higher frequencies, where it is usually most needed. In addition the highest octave covers the largest frequency range. In FIG. 4, it covers 500 Mhz to 1000 Mhz or approximately one-half the total frequency range.

It should be noted that in a general sense, the first coupler need not cover exactly the same frequency range as the second coupler, a long as there is some overlap in their frequency range. The system will operate as it normally does with two indentical couplers in the range of the overlap. Outside of this range, it will operate as it does outside the bandpass of two identical couplers.

Figure 1B:
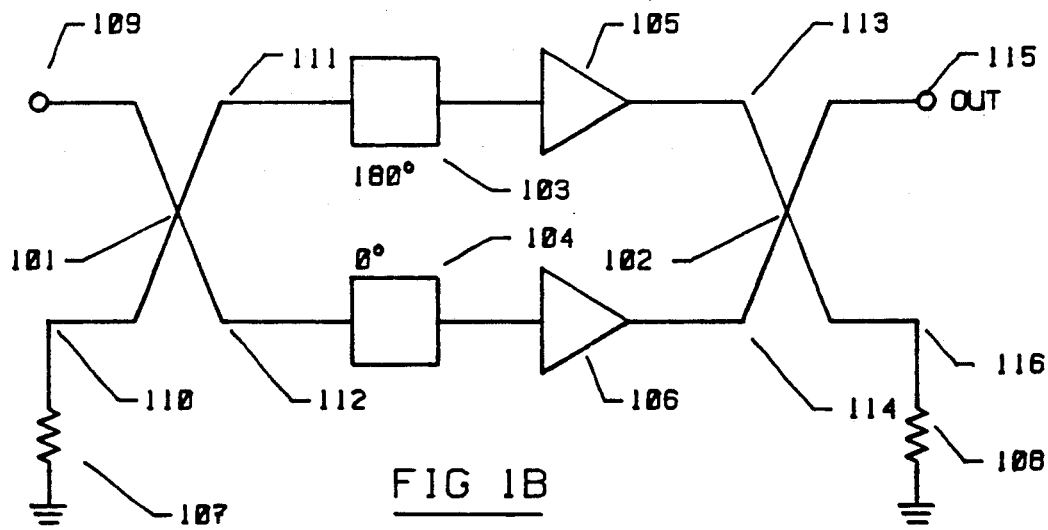
FIG. 1B is a simplified diagram of one embodiment of the present invention.

An embodiment of the present invention is shown in FIG. 1B. The same numerical designation used in FIG. 1A are again used in FIG. 1B; however, a 180 degree phase shifter 103 and a zero degree delay line 104 are place in series with the inputs of the amplifier 105 and 106, respectively. Although in this figure, the 180 degree phase shifter is placed in series with the input of amplifier 105, while the zero degree delay line is placed in series with the input of amplifier 106, it is possible, without materially affecting the performance of the present invention, to reverse the positions of the phase shifter and delay line, or to place either device before or after or within the amplifiers, or to change the amount of phase shift in either the zero or 180 degrees shifter, as long as the differential between the two remains at 180 degrees. The phase shifters must be capable of passing the lowest frequency of interest for the line they are placed in series with.

The 180 degree phase shifter is a wideband phase shifter that may be constructed in several ways. One way is to fabricate it from a section of transmission line such as a semi-rigid line at the characteristic impendance used in the system. The line length is normally one-eight of a wave length at the highest frequency of operation. For example, if the highest frequency of operation were 1000 Mhz, the line length would be appoximately one inch long, when the effect of the dielectric constant of the cable medium is taken into account.

The outside shield of the cable should be covered with ferrite beads at various points along its length to contain current flow to the inside of the cable. To produce the wideband 180 degrees shift, the leads at one end of the cable are reversed. That is, the center conductor is connected to ground and the shield is connected to the center conductor of the cable used to carry the signal away from the phase shifter.

The zero degree delay line is constructed in a manner identical to the 180 degree phase shifter, except the shield and center conductor are not reversed at one end when the delay line is connected to another transmission line. Its function is to compensate for the transmission delay through the 180 degree phase shifter. When both the phase shifter and delay line are placed in series with the input of the amplifiers as shown in FIG. 1B, the results is as though a perfect 180 degree phase shifter with no through transmission delay were placed in series with one of the amplifiers. This type of zero degree phase shifter passes frequencies down to D.C.

Adding a 180 degree phase shifter in series with one of the amplifier produces a number of beneficial results, the most important of which is permitting the coupled amplifiers to function well beyond the frequency range of the couplers. This is to be distinguished from prior art circuitry which employed 180 degrees phase shifters in a similar configuration to extend the bandwidth of the couplers a small amount, such as only 10 to 20% of the original bandwidth. In the present invention, the operating bandwidth can be expanded from one to ten octaves or more.

Many prior art circuits employed microwave quadrature couplers which covered only an octave, but which did not require a through-line path through the coupler. It is absolutely necessary for the couplers used in the present invention to contain a through-line or, as a minimum, a line that will pass the lowest frequency of interest. Couplers of this class with through-lines that pass signals down to D.C. include wire couplers and strip line or printed couplers.

Basically, the wire couplers contain two wires placed in close proximity, while the printed couplers contain two printed lines in close proximity. Both, however, have a through-line, D.C. path through them, made by means of either a directly connected wire or an unbroken printed line. The through-line portion of these couplers functions as a transmission line at an impedance close to the characteristic impedance of the coupler at frequencies away from the operating frequency of the coupler.

However, it is not sufficient to merely use a through-line coupler to gain the increase bandwidth. The added 180 degree transmission phase differential in the two path between the two couplers is necessary to reverse the output port from which the system output is obtained. Note in FIG. 1A, the output is obtained from port 116, however, in FIG. 1B the output is obtained from port 115. This is a crucial difference necessary for the operation of the present invention.

Since output port 115 in FIG. 1B is directly connected by a single line going through the couplers and amplifier 106 to the input port 109, port 115 is considered the system "through-line" output port. By way of contrast, port 116 is only connected to the input port by way of coupling in the couplers. Note also that this use of the 180 degee phase shifter in the present invention is not to increase the bandwidth of the coupler as was the case in the prior art, but to always place the output signal on the through-line output port 116, regardless of whether the system is operating in the coupled or in the through-line mode.

The operation of the through-line and coupled modes will now be explained in detail with the aid of FIG. 1B. In this figure, the couplers 101 and 102 are essentially in tandem. This is true, even though a 180 degree phase shifter, a zero delay line, and two amplifiers are connected between the two couplers. The amplifiers are in most instances identical and produce equal gain and transmission delay which in effect makes them compensate for one another. Similarly, the loss and delay through the 180 delay phase shifter is compensated for by the loss and delay through the zero delay line. These matched gains, losses and delays of the amplifiers and of the phase shifter and delay line cause the couplers to function as though they were connected directly in tandem with only a perfect (no transmission delay) 180 degrees phase shifter connected between them.

As noted above, when tandem couplers include a 180 degree phase shift between them, the output port from which the signal emerges is shifted. For example, in FIG. 1A, the system input port is port 109, while the output port is port 116. However, in FIG. 1B, the input port is the same, but the output port is shifted to port 115 because of the 180 degree phase shift in the system.

The advantage gained by this shift in the output port can be seem by tracing the signal flow through the systems of FIGS. 1A and 1B. In the prior art system of FIG. 1A, port 109 is connected by a direct line through coupler 101 to amplifier 106. The output of amplifier 106 is connected by a direct line through coupler 102 to port 115 and terminating load 108. When operating out of the frequency band of coupler 101, the signal applied to port 109 is amplified in amplifier 106 and then fed to a terminating load where it is dissipated. In this prior art arrangement, the input signal never reaches the output port when its frequency is out of the operating frequency range of the couplers. No signal is coupled to amplifier 105 and no signal from amplifier 105 is fed to the system output port 116.

The reverse occurs in the present invention, which is shown in FIG. 1B. When a signal that is out of the operating frequency band of couplers 101 and 102 is applied to the system input port 109, the signal is directly connected through a through-line in coupler 101 to amplifier 106. The output of amplifier 106 is directly connected through a through-line in coupler 102 to the system output port 115. A signal applied either within or without the operating bandwidth of the couplers is delivered to the same system output port 115, thereby providing continuous amplification well beyond the couplers useful frequency range. It is possible in the present invention to pass signal down to D.C., if this is desired.

Although the couplers still function only over their useful frequency range and the system provides the power handling capability and VSWR of only one amplifier outside of the frequency range of the couplers, there are additional major advantages to such an arrangement over and above the greatly extended frequency range.

In a practical amplifier, the power handling capability drops off as the frequency is increased. The power handling capability of an amplifier is commonly determined by measuring the output level at which the gain compresses one dB. This point is symbolized as Po1dB.

Figure 2A:
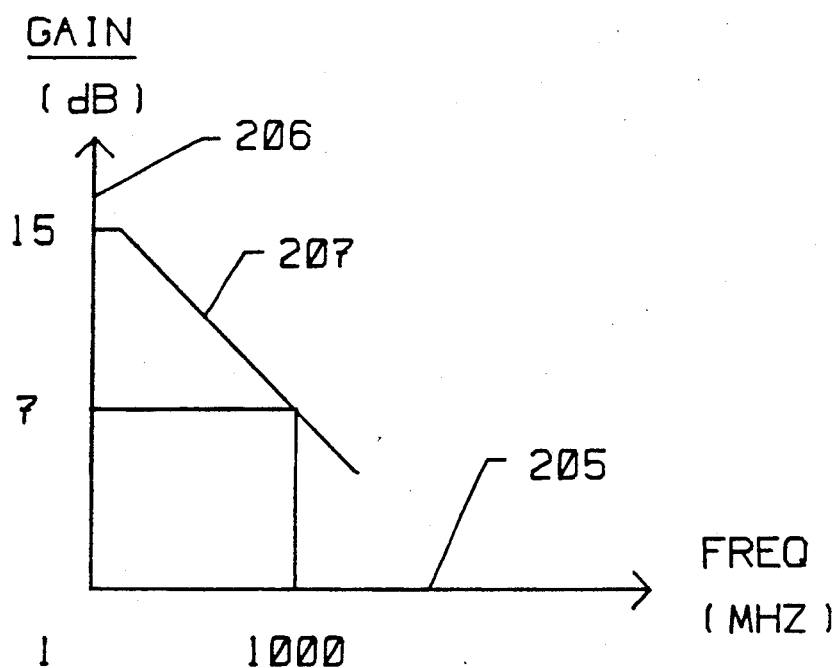
FIG. 2A is a plot of the gain of an amplifier stage as a function of frequency.
Figure 2B:
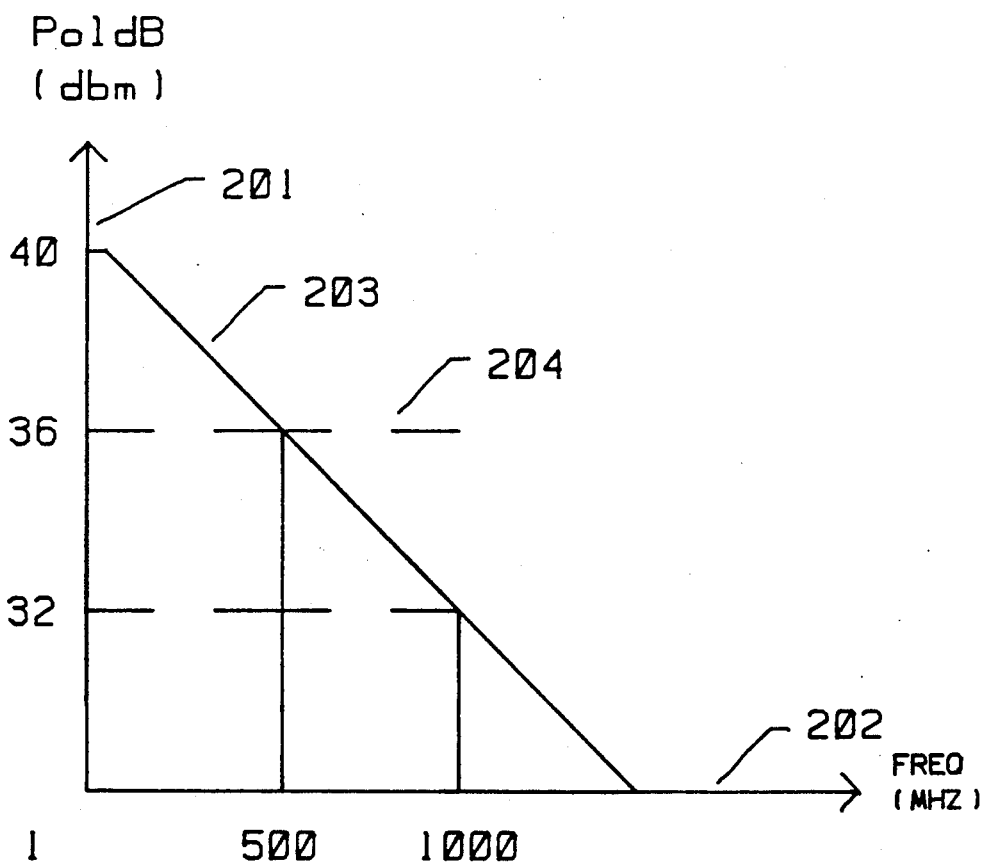
FIG. 2B is a plot of the output power of an amplifier stage as a function of frequency.

A plot of the gain of an amplifier as a function of frequency is shown in FIG. 2A. In this figure, the ordinate 206 represents gains while the abscissa 205 represents frequency. The gain plot 207 falls off with frequency usually at an initial 6 dB per octave rate. A similar roll off, although not necessary at exactly the same rate, occurs with the Po1dB level. A plot of the Po1dB of a typical amplifier is shown in FIG. 2B. In this figure, the ordinate 201 represents Po1dB in dBm, while the abscissa 202 represents the frequency in Mhz. Solid line curve 203 represents the typical Po1dB of an amplifier, while the dotted line curve 204 represents the desired Po1dB of an amplifier. The ideally desired Po1dB would generally remain constant throughout the frequency range of the amplifier, but in practice the actual power handling capability as shown by Po1dB curve drops off with increased frequency. This drop off in Po1dB may be compensated by the circuit of the present invention, making it possible to achieve the desired flat Po1dB characteristic.

In a specific application of the present invention, a conventional amplifier covering 1 to 1000 Mhz supplied a minimum of three watts up to 500 Mhz, but thereafter, the power dropped off to a low of 1.5 watts at 1000 Mhz. By adding a second power stage in the final, using the basic configuration of the present invention shown in FIG. 1B, the power handling capability was raised to 3 watts minimum through out the band of 1 to 1000 Mhz.

In this same application, a high output VSWR was encountered at 600 Mhz with a single conventional amplifier. This high VSWR is difficult to correct, because it lies near the middle of the band. The difficulty and method of corrrection are explained in detail below.

Unfortunately, most circuits intended to correct VSWR at midband have serious and usually intolerably deleterous effects at the high end of the band. However, with the application of the present invention the VSWR masking effect of the couplers, which covered a single octave, 500 to 1000 Mhz, was used to the correct the poor VSWR at high end of the band. Simultaneously, the application of the present invention also eliminated the low output power problem described above. There were no adverse effects anywhere else in the operating frequency range of the amplifier.

Figure 3A:
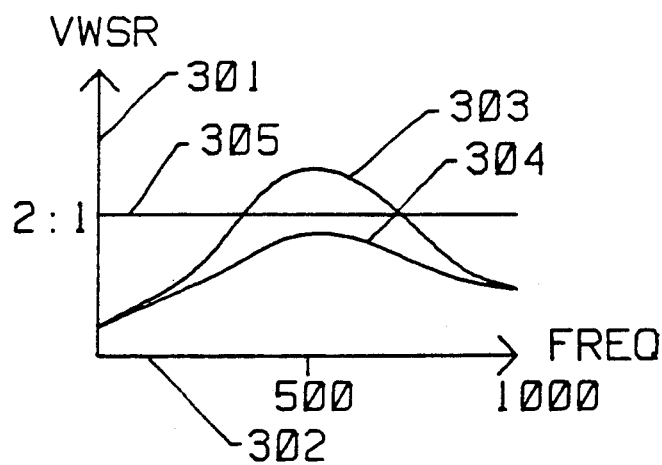
FIG. 3A is a plot of the output VSWR of an amplifier stage as a function of frequency.
Figure 3B:
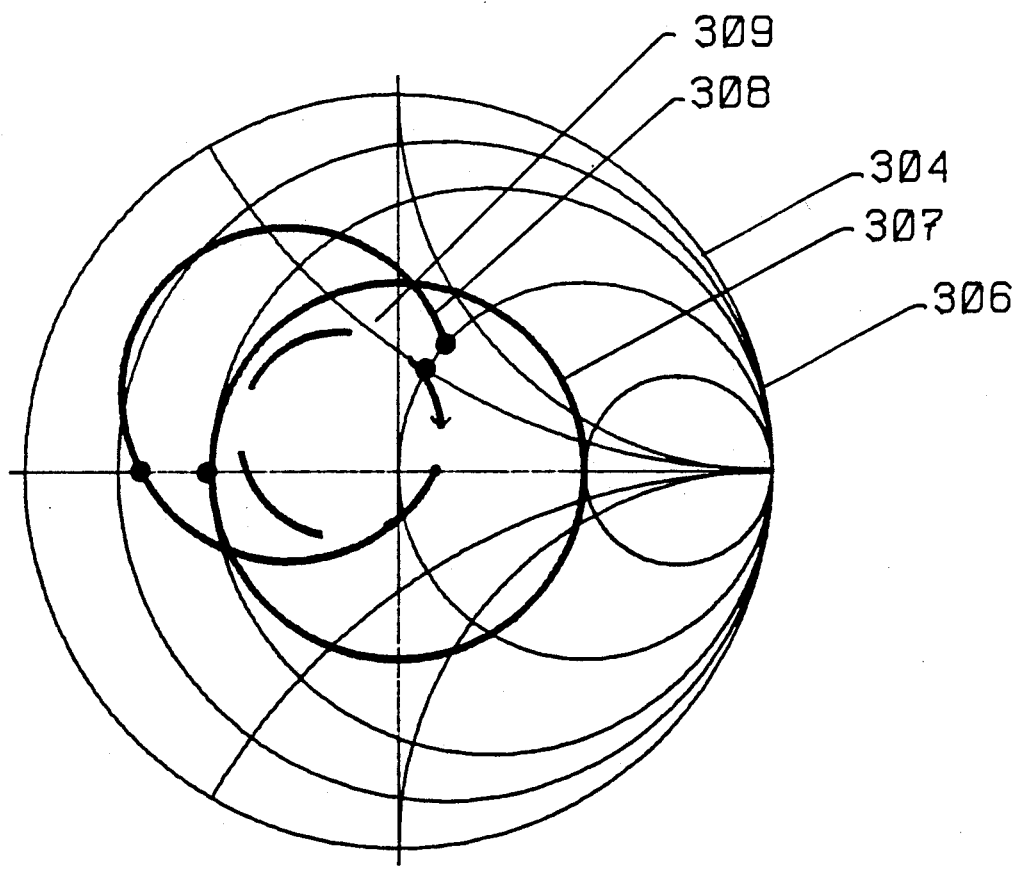
FIG. 3B is a Smith Chart plot of the output impedance of amplifier stage as a function of frequency.

This specific VSWR problem is illustrated in FIGS. 3A and 3B. FIG. 3A is a plot of the VSWR of an output stage as a function of frequency, while FIG. 3B is a Smith Chart plot of the output impedance the same amplifier stage.

FIG. 3A comprises an ordinate 301 representing VSWR, an abscissa 302 representing frequency, a first VSWR plot 303, showning the high VSWR prior to the application of the present invention, and a second greatly improved VSWR plot 304, after the application of the present invention. Throughout the band, the improved plot 304 can be seen to lie below the 2:1 VSWR line 305.

FIG. 3B comprises a Smith Chart 306, a 2:1 VSWR circle 307, a first Smith Chart plot 308, showing a high VSWR greater than 2:1 at midband and a second Smith Chart plot 309 showing a low VSWR of less than 2:1 over the entire frequency range made possible by the application of the present invention.

Typically the amplifier designer's objective is to provide the proper load line to the output stage and at the same time provide an amplifier output VSWR of less than 2:1. The output VSWR represented by plots 303 and 308 are particularly difficult to reduce below 2:1 as noted earlier because the range over which they exceed 2:1 lies in the middle of the pass band of the amplifier. For example, it is an easier task to reduce the VSWR below 2:1 at the high end of the band because a small series inductance, or a small shunt capacitance, or both, may be employed. Their effect is seen at the high end of the band, where it is desired; however, their effect diminishes and essentially disappears as the frequency is reduced.

Applying similarly placed, but larger valued, shunt capacitance and series inductance to be effective at midband may correct the midband VSWR problem, but most likely would simultaneously cause a serious VSWR problem at the high end of the amplifier's operating band. The effect of the larger shunt capacitance and series inductive in fact will be magnified at the high end of the band, rather than diminished, because of the higher frequency.

The present invention can be employed simply and effectively to eliminate this problem. The VSWR can be made to lie will below 2:1 even if the actual VSWR of the output stages approaches infinity. This is possible because of the quadrature coupler which mask the VSWR of the output stages, regardless of how high they are, as long as these stages have similar VSWR's.

Where only an octave coupler is used and VSWR is of prime concern, the center frequency of the coupler can be moved to where the VSWR improvement is desired. However, in most cases, this is not necessary. VSWR usually requires improvement in midband or at higher frequencies. Locating the center frequency of the coupler so that it covers the upper half of the bandwidth to improve output power over this portion of the band, where it is most often needed, will also improve VSWR where it is most needed.

There is an additional benefit derived from the output coupler. High power reflected back to the amplifier from the infinite VSWR load that often occurs from an open output cable is not totally absorbed by the transistors if the transistor presents something other than a prefect VSWR and the appropriate terminating load is placed on the isolated part of the coupler. The power reflected by the transistors is directed to the load by the coupler, where it is dissipated.

The frequency range over which both amplifiers, such as amplifiers 105 and 106 in FIG. 1B, are used to supply power to the system output port easily can be extended by adding a third and a fourth coupler that have an operating frequency range which differs from that of the first and second couplers.

Figure 5:
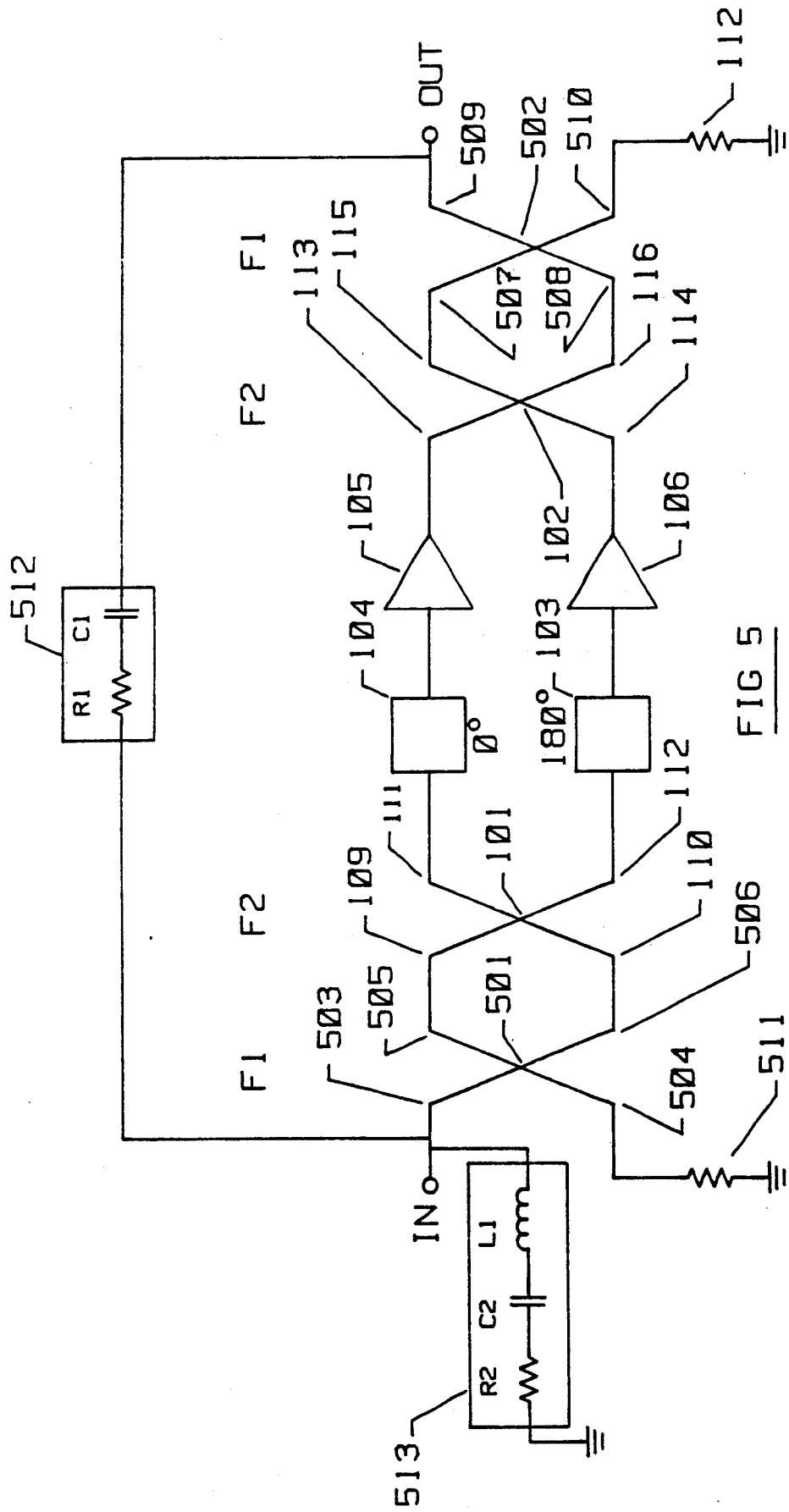
FIG. 5 is a diagram showing the way in which cascaded couplers of different center frequencies may be used to extend the frequency range over which the benefit of the couplers may be obtained.

This configuration is shown in FIG. 5. In this figure the basic circuit of the invention, as shown originally in FIG. 1B, has been redrawn using the same drawing numerals as in FIG. 1B. Added to the basic configuration are couplers 501 and 502. Each coupler has two input ports 503 and 504 for coupler 501, and 507 and 508 for coupler 502. Each coupler also has two output ports, 505 and 506 for coupler 501, and 509 and 510 for coupler 502.

Coupler 501 is connected to coupler 101 by connecting port 505 to port 109 and port 506 to port 110. Similarly, coupler 102 is connected to coupler 502 by connecting port 115 to port 507 and port 116 to port 508.

Terminating loads 107 and 108 have been removed. These are replaced by terminations 511 and 512 which have one terminal grounded and the other terminal connected to ports 504 and 510, respectively.

Phase shifter 103 and 104 are reversed in positions to place the zero degree phase shifter 104 in the direct path through the whole system of FIG. 5. It should be noted that as long as both the phase shifters function down to a desired frequency, it does not matter which position either is placed in. Also, as noted earlier neither phase shifter need be exactly zero degree or 180 degrees, as long as over frequency they generally maintain a phase differential between them of 180 degrees. Despite this flexibility, the phase shifters have been reversed in FIG. 5 to represent a practical case, when transmission line phase shifter are used, and the 180 degree shifters includes a cross-over of the center conductor and the shield. In this case, the lowest possible frequency will be transmitted through the system when the phase shifters are placed as shown in FIG. 5.

In the operation of the circuit of FIG. 5, couplers 501 and 502 operate over a frequency band centered about a frequency f1, while couplers 101 and 102 operate over a frequency band centered about a frequency f2. The amplifiers 105 and 106 operate over a frequency band which not only incorporated the operating band of each of each coupler pair, but extended beyond them. Normally, the couplers centered at f1 do not couple signals at f2, and the reverse is true for the coupler centered at f2. When a signal is applied to a coupler out of its operating frequency range, it merely functions as a direct transmission line.

When a signal at f1 is applied to the new system input port 503 it is divided into two signals which emerging at ports 505 and 506. From these ports, the two signals are transmitted through coupler 101, as though through two transmission lines created by each arm of the coupler to amplifiers 105 and 106 by way of the two phase shifters. The two signals are amplified and then passed through coupler 102 again they are combined and delivered to the new system output port 509.

When a signal at f2 is applied to the new system input port 503, it simply passes through to port 110 as though through a direct transmission line. From this point, until it reaches port 116, it is processed in a manner similar to that described in connection with FIG. 1B. After emerging from port 116 it is transmitted through coupler 502 as though through a transmission line to the new system output port 509.

Tracing the above paths through the couplers illustrates that the system shown in FIG. 5 functions as a coupled amplifier over the operating frequency ranges of both couplers. Theoretically, it is clear that any number of coupled sets can be added in this manner to extend the coupler amplifiers frequency range with all the attending advantages of guadrature coupled amplifiers. A practical limitation on the number of couplers is the cumulative insertion loss of many couplers placed in series. However, in practice at least two to three couplers can be cascaded in this way. The bandwidth over which an improvement can be obtained may be multi-octave, even though only single octave couplers are used. Where multi-octave couplers are used, the bandwidth can be extended ever further for the same number of couplers.

When a signal, which is not within the operating band of either coupler, is applied to the new system input port 503, it passes through ports 506, 110, 111, phase shifter 104, amplifier 105, ports 113, 116, 508, and finally to the new system output port 509. The tracing of this path illustrates that there is a direct path through the system shown in FIG. 5 and that this systems functions as an amplifier when operated out of the bands of either coupler.

Couplers placed in tandem as shown in FIG. 5 are often used to extend the combined couplers effective bandwidth; however, the couplers are typically not 3 dB coupler. The configuration of FIG. 5 is not limited to 3 dB couplers, but it is important to note that they can be 3 dB couplers and still effectively extend the bandwidth over which the benefit of the couplers is obtained. This is true in part because the normally accepted bandpass flatness for amplifiers is $\pm 1$ dB. A small ripple in the bandpass flatness caused by coupler interaction can be either accepted if less than $\pm 1$ dB or corrected by means of a feedback circuit or a shaping network, both of which are described below.

Maintaining the amplitude flatness within a few tenths of a dB over a wide band is normally an important feature in broad band couplers which incorporate two or more tandem couplers. This is not always possible nor necessary to achieve when 3 dB couplers are combined in tandem as shown in the configuration of FIG. 5; however, it is possible to approach this degree of flatness in a broad band amplifier by means of either a feedback circuit or a shaping network, which are often used to correct gain roll-off and gain peaks normally occurring within the band of amplifiers. These techniques of correcting passband anomalies can be extended to aid in correcting similar effects introduced by the 3 dB tandem couplers. For example in FIG. 5, to improve the flatness of the system bandpass, a feedback circuits symbolized by R1 and C4 is placed around the entire stage from the new input port to new output port which includes the couplers. A simple shaping network 513 symbolized by an RLC consisting of R2, L1, C2 is connected from the new system input to ground.

The feedback circuit senses the level of the output signal and feeds back a portion of it to the input in proper phase relation to aid in leveling the output. When the feedback loop includes the couplers, it aids in correcting for perturbations caused by the couplers.

Shaping networks, on the other hand, are generally frequency sensitive attenuators which reduce gain over selected frequency ranges. For example, the RLC circuit 503 of FIG. 5 will add the dampening effect of a shunt resistor, R2, at the frequency of resonance of L1 and C2. A gain peak caused by the tandem couplers can be corrected by a shaping circuit such as 513.

In many electronic systems, an important consideration is system reliability. One way of providing system reliability is to design the system so that it will continue to function despite the failure of some of the systems components.

Figure 6:
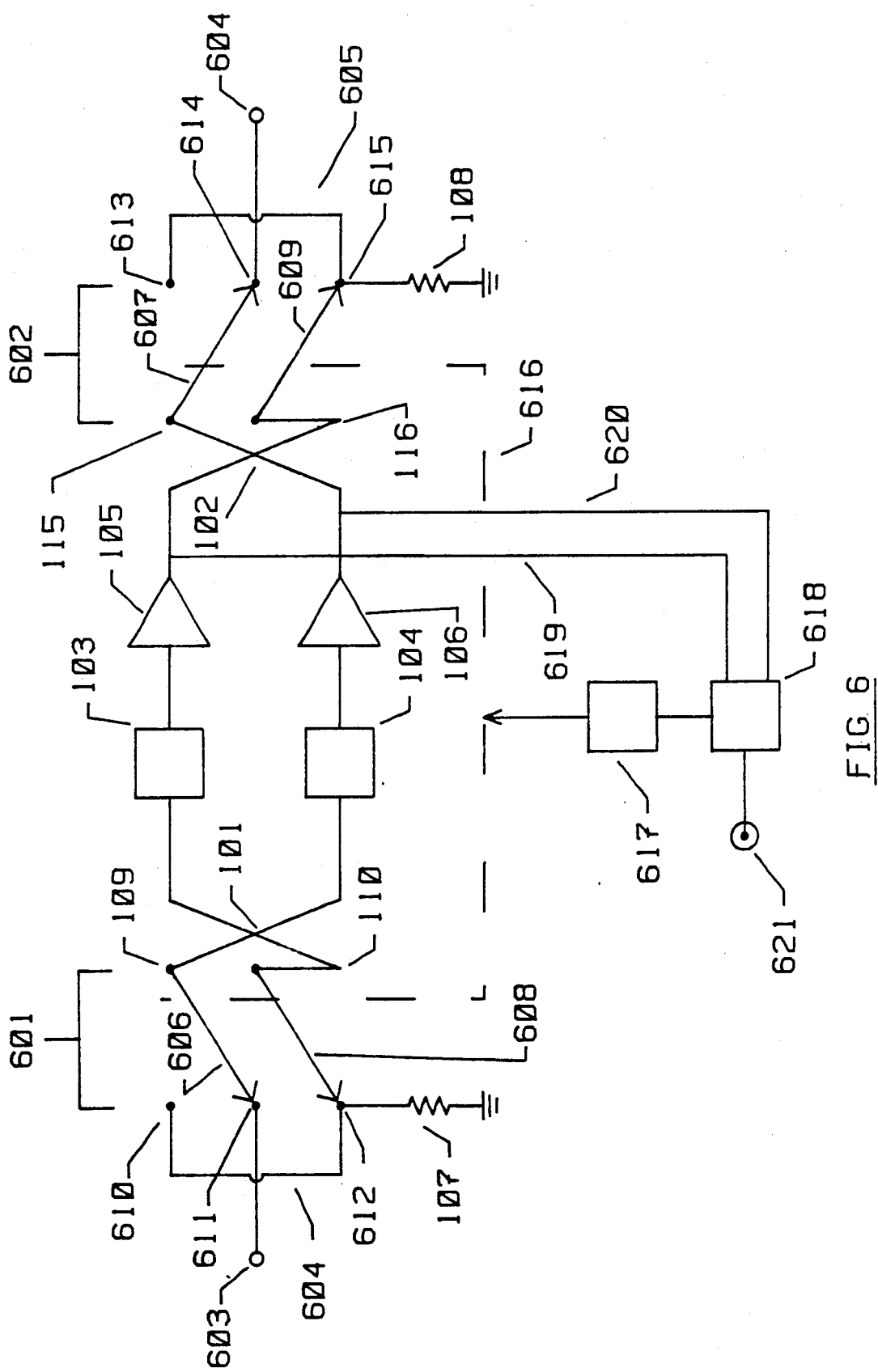
FIG. 6 is a diagram showing a switching method by which the amplifier redundancy in the present invention may be used to preserve operation in the event of failure of one of the amplifier.

This feature can be incorporated in the present invention as shown in FIG. 6. In this Figure, two ganged, double-pole-double-throw switches are added to the circuitry of FIG. 1B. Switch 601 is located at the system input, while switch 602 is located at the system output. Switch 601 includes two switch arms 606 and 608. Arm 606 is connected to coupler port 109, while arm 608 is connected to coupler port 110. Switch 601 also includes three contacts 610, 611 and 612. Contact 610 is connected to contact 612 by means of line 604 which is also connected to one terminal of termination 107. The remaining terminal of termination 107 is grounded.

Arm 606 switches between contacts 610 and 611, while arm 608 simultaneously switches between contacts 611 and 612. The arms are ganged so that when arm 606 is at contact 610, arm 608 is at contact 611. When arm 606 is at contact 611, arm 608 is at contact 612. Contact 611 is connected to a new system input port 603.

In the operation of switch 601, the system new input port 603 may be connected to either input port 109 or 110 of the coupler 101. When the position of switch 601 connects coupler input port 109 to the new system input port 603, it also connects coupler port 110 to termination 107. When the switching position is changed, coupler port 110 is connected to the new system input port 603 and coupler port 109 is connected to termination 107. In effect, switch 601 switches the new system input port to one or the other of the two input ports of coupler 101 and terminates the remaining input port.

Switch 602 at the output of the system also includes two arms 607 and 609, and three contacts 613, 614 and 615. Arm 607 is connected to the output port 115 of coupler 102, while arm 609 is connected to output port 116 of coupler 102. Arm 607 switches between contacts 613 and 614 while arm 609 switches simultaneously between contacts 614 and 615. Arms 607 and 609 are ganged together and are also ganged with arms 606 and 608 of switch 601 so that when arm 606 is at contact 610, arm 608 is at contact 611, arm 607 is at contact 613 and arm 609 is at contact 614. When the switch positions are changed arm 606 is at contact 611, arm 608 is at contact 612, arm 607 is at contact 614 and arm 609 is at contact 615. Contact 614 is connected to a new system output port 604, while contact 613 is connected by a line 605 to contact 615 which is also connected one terminal of termination 108. The remaining terminal of termination 108 is grounded.

In the operation of switch 602, the new system output port 604 may be connected to either output port 115 or 116 of coupler 102. When the position of switch 602 connects coupler 102 output port 115 to the system output port 603, it also connected coupler output port 116 to termination 108. When the switching position is changed, coupler port 116 is connected to the new system output port 604, and coupler port 115 is connected to terminations 108. In effect, switch 602 switches the new system output port to one or the other of the two output ports of coupler 102 and terminates the remaining output port.

The ganging of switches 601 and 602 provides a means of selecting one or the other of two possible directly connected paths through the system. The directly connected path through the couplers that includes amplifier 105 or the directly connected path that includes amplifier 106 may be chosen by positioning the switches. In the event of failure of one or the other of the amplifiers, the path which includes the operating amplifier may be chosen to keep the system operating at full output away from the operating band of the couplers and at reduced power within the coupler operating band.

Often there is only a partial failure of an amplifier. A common failure is the cracking of a chip capacitor which results in a reduction of gain and power only at low frequencies. In such cases switching the fully operational amplifier to the direct connection path through the couplers will result in no degradation of performance at any frequency because the partially failed amplifier will only be utilized in its high frequency range, which is typically the same as the operating range of the couplers.

It is possible to make the switching automatic to maintain operation in the event of fault by means of a fault detection circuit 618 and switch drive circuit 617 as shown in FIG. 6. There are two amplifier signal paths through system of FIG. 6, each consisting of the circuit making a direct connection with each amplifier. A system signal applied at the input port passes through one or both of the signal paths to the output port. A fault detector is connected to each amplifier signal path to detect the presence of a signal. This is represented in FIG. 6 by lines 619 and 620 which connect the outputs of amplifier 105 and 106 respectively to the fault detector 618.

In system where both paths are intended to carry some signals continuously, the fault detector need only detect the absence of a signal in one amplifier signal path. If that path is the direct path at the time of detection, the system is switched automatically to make the direct path the one without the fault. This is accomplished by means of a logic circuit in the fault detector which acts on the signals received from the amplifier signal path to generate a command signal to a switch driver circuit 617, which, in turn, appropriately activates the ganged switches 601 and 602.

When the switching has been completed, all signals within the bandwidth of the operating amplifier will continue to be passed through the system despite the failure of one amplifier signal path.

When signals are not present continuously, the fault detector can be arranged to accept a system signal input at port 621 of fault detection circuit 618. This input indicates the existence of a system signal that should be present in the signal path of both amplifiers. The logic circuitry within the fault detector 618 is design not to initiate a switch command signal to the switch driver 617, unless the system signal input at port 621 is present.

The detection logics, command signal generation, and switch driver circuitry required to execute these functions are well known to these skilled in the art and require no further elaboration herein.

It is possible to utilize the stage that is not coupled to the through-line over the frequency range where it is not normally used. That is the range outside the bandwidth of the couplers. The circuitry required to accomplish this is shown in FIGS. 7A and 7B.

Figure 7A:
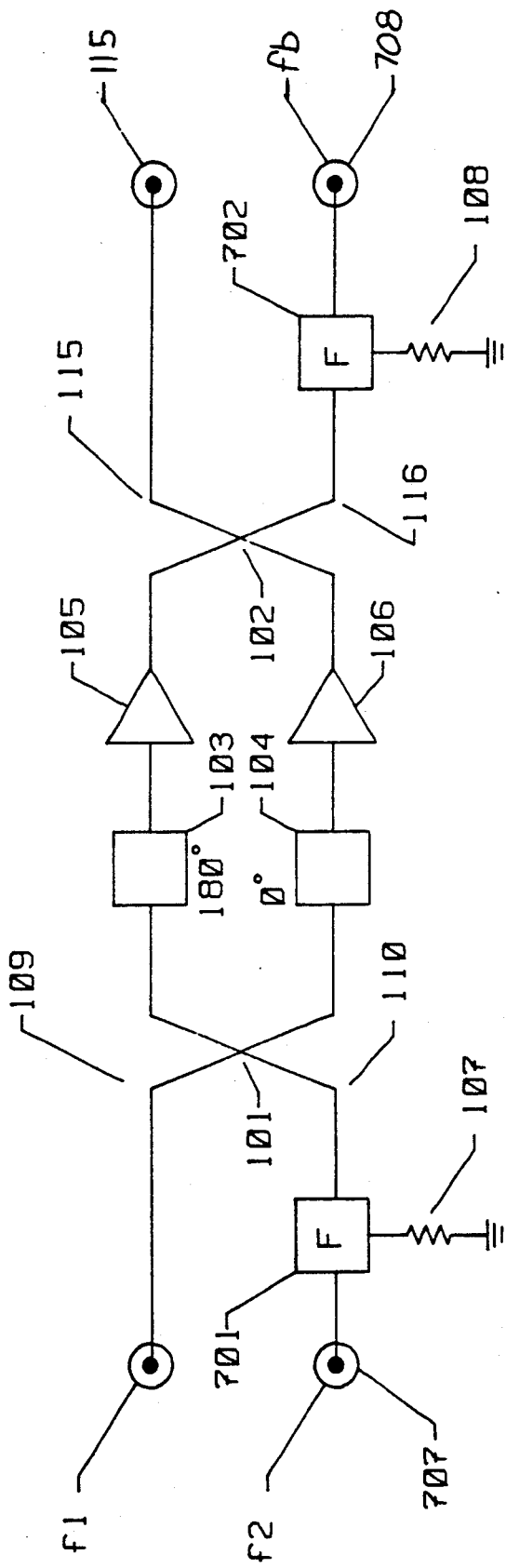
FIG. 7A is a diagram showing a system in which both amplifiers in the present invention may be fully utilized over their complete frequency range.

FIG. 7A is similar to the basic configuration of the invention shown in FIG. 1B, with the exception that filters 701 and 702 have been added along with additional ports 707 and 708.

Filter 701 is located in series between port 110 and port 707, while filter 702 is located in series between port 116 and port 708. Termination 107 is now connected between filter 701 and ground, while termination 108 is now connected between filter 702 and ground. Port 707 is an alternate input port to the system that permits access to amplifier 105 at frequencies out of the bands of the couplers. Similarly, port 708 provides access to the output of amplifier 105 at frequencies out of the band of the couplers.

Figure 7B:
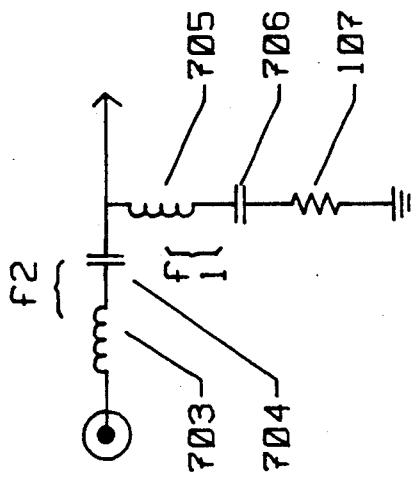
FIG. 7B is a diagram of a filter which may be used in the system of FIG. 7A.

Filter 707 is illustrated in more detail in FIG. 7B. It comprises inductors 703 and 705 and capacitors 704 and 706. Inductor 703 and capacitor 704 are in series with the line from port 707 to the input of amplifier 103 via coupler 101. These filter elements symbolically represent a bandpass filler that allows the flow of signal at frequencies out of the passband of the couplers (f2), but within the range of amplifier 105.

Inductor 705 and capacitor 706 are in series and connected between the line going through coupler 101 to the input of amplifier 105, and the ungrounded terminal of termination 107. Inductor 705 and capacitor 706 symbolic represent a bandpass filter that allows the passage of signals at frequencies within the bandpass of the couplers (f1), permitting the coupler 101 to have its isolated port terminated in termination 107 at frequencies within its passband.

Filter 702 is identical to filter 701, only port 708 is substituted for port 707 and termination 108 is substituted for termination 107.

In the operation of the configuration shown in FIGS. 7A and 7B, signals applied to input port 109 emerge at port 115 in the normal manner for the present invention. Any symmetrical reflection at frequencies within the bandwidth of the couplers (f1) reach the termination via the bandpass filter represented by inductor 705 and capacitor 706. Signals out of the passband of the couplers pass through the filter represented by inductor 703 and capacitor 704 to reach amplifier 105. These signals continue through the amplifier and emerge at port 708. When the amplifiers are operated in their linear range, there is no interaction between signal in or out of the passband of couplers because the bandpass filters will only pass signals within their band and present an open to all others frequencies.

For example, in a system operating from 1 to 1000 Mhz where the couplers bandpass is 500 to 1000 Mhz, any signals in the 500 to 1000 Mhz range (f1) reflected by amplifier 105 and 106 would pass through the filter formed by elements 705 and 706, but would be blocked by the filter formed by elements 703 and 704. Similarly, signals from 1 to 500 Mhz (f2) would be passed by the filter formed by elements 703 and 704 and would arrive at the input of amplifier 105, but would be blocked from flowing into termination 107 by the filter formed by elements 705 and 706.

The result of this configuration is the bandwidth capability of amplifier 105 from 1 to 500 Mhz which would ordinarily be unavailable for use, now becomes available at input port 707 and output port 708.

Rather than simply using two identical amplifiers capable of covering identical bandwidths, it is possible to use an amplifier in the coupled circuit, such as amplifier 105 in FIG. 1B, that is optimized for best performance over the bandwidth of the couplers. However, to gain all the advantages of the couplers, it is necessary for both amplifiers to have identical input and output impedances and transmission phase over the bandwidth of the couplers. This later requirement may be achieved in part by adding phasing networks in either the direct or coupled paths to compensate for any difference in phase caused by optimizing amplifier 105. It is possible, for example, to incorporate such networks in the phase shifter 103 and 104 in FIG. 1B.

Figure 8:
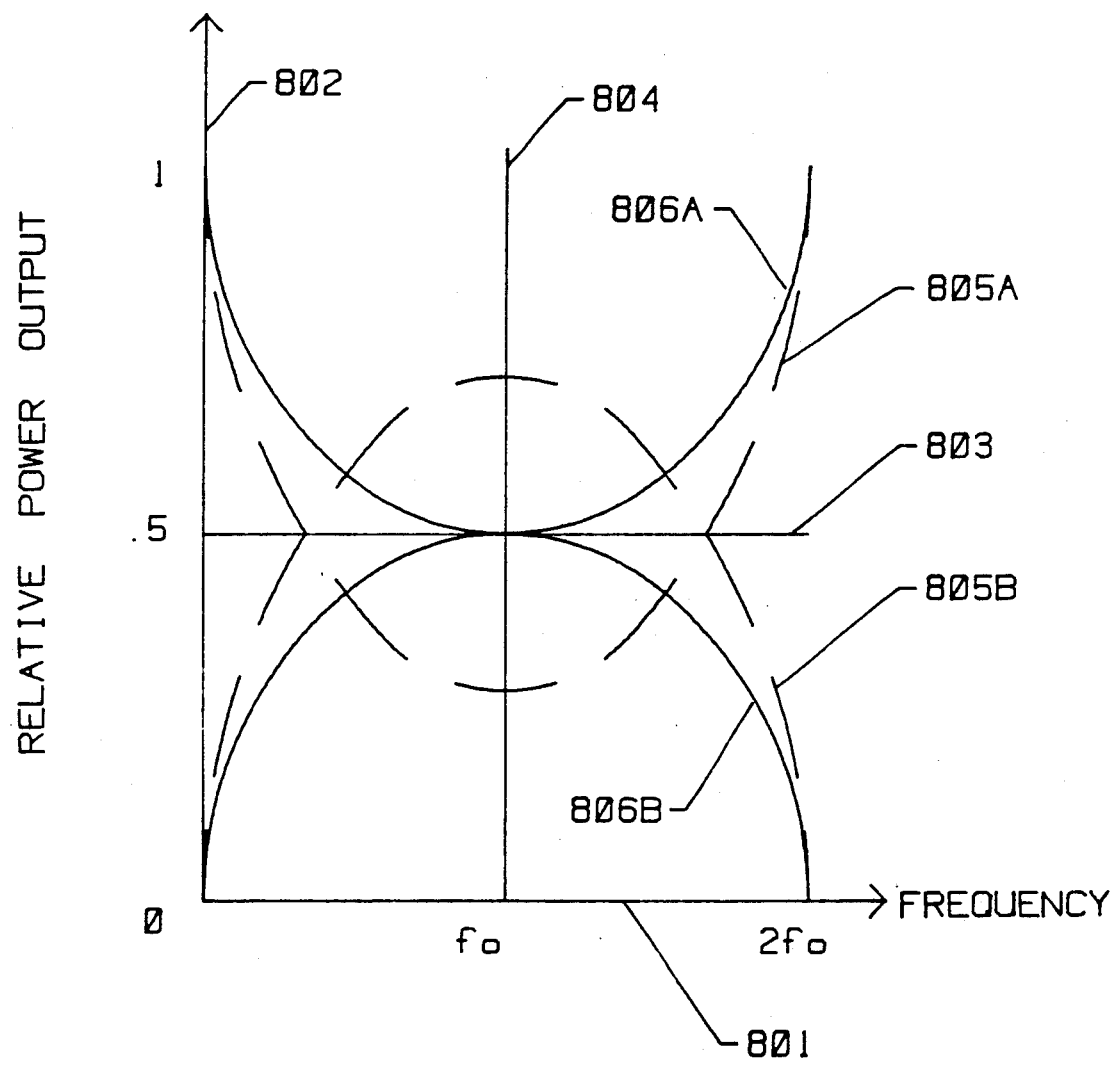
FIG. 8 is a graph showing the degree of coupling that can be provided by an over coupled quadrature coupler.

Further optimization is possible by using over coupled gradrature couplers. This type of coupling is illustrated in the plot of FIG. 8. In this figure, the abscissa 801 represents the frequency while the ordinate 802 represents power level. The horizontal line 803 represents the half power coupling level, while the vertical line 804 represents the center frequency, fo, of the coupler. The solid curves 806A and 806B represent the coupling as a function of frequency of a coupler that achieves equal, half power, or 3 dB coupling level about the center frequency of the coupler. The dashed curves 805A and 805B represent the coupling as a function of frequency for an over-coupled coupler. Such a coupler may receive at the coupler port 75% of the input power to the coupler, rather than the 50% achieved by the coupler represented by curves 806A and 806B. At the same time the direct port of the over coupled coupler receives only 25% of the input power as illustrated by curve 805A.

If, in the present invention, the coupled amplifier 105 is optimized, over the relative narrow band of the couplers, to produce three times the power of the direct amplifer 106 and overcoupled coupler such as illustrated in FIG. 8 is used, then the output power over much of the passband of the coupler can be ideally raised three to four times that of the amplifier 106 rather than only twice. To obtain optimum power output it is necessary for the output voltages developed by the amplifiers to be in a ratio equal to the coupling ratio. Wire couplers which are overcoupled are standard products and optimization of an amplifier to increase power over a reduced bandwidth, such as that of the couplers is regularly achieved, making this feature of the invention commercially feasible.

Having described my invention, I claim:

1. An amplifier system comprising:
    (a) a first quadrature coupler, having a coupled pass band over its operating frequency range, comprising a first and a second input port, and a first and a second output port, said first input port being directly connected to the second output port by means of a direct through-line through said coupler, and said second input port being designated as an isolated port of said first coupler,
    (b) a second quadrature coupler having a coupled passband over its operating frequency range which overlaps at least a portion of the coupled pass band of said first quadrature coupler, comprising a first and a second input port and a first and a second output port, said second input port being directly connected to said first output port by means of a through-line through said second coupler, and said second output port being designated the isolated port of said second coupler, (c) a first amplifier having an input port and an output port and a passband that overlaps and exceeds that of said first and second quadrature couplers, (d) a second amplifier having an input port and an output port, and a passband that at least equals that of said first amplifier, (e) means for providing the following connections:
  (1) the input port of the first amplifier to the first output port of the first quadrature coupler,
  (2) the output port of the first amplifier to the first input port of the second quadrature coupler,
  (3) the input port of the second amplifier to the second output port of the first quadrature coupler,
  (4) the output port of the second amplifier to the second input port of the second quadrature coupler, (f) a first phase shifter connected directly in series with said first amplifier, and (g) a second phase shifter connected directly in series with said second amplifier, said second phase shifter having a phase difference from said first phase shifter of nominally one-hundred-and-eighty degrees to enable a signal applied to an input port of the first quadrature coupler to pass through both quadrature couplers via both amplifiers in the overlapping portion of the operating frequency range of the quadrature couplers and to pass through a direct path formed of the electrical path through the through-line of the first quadrature coupler, the second phase shifter, the second amplifier, the through-line of the second quadrature coupler to the first output port of the second coupler when said signal is outside the overlapping portion of the operating frequency range of said quadrature couplers, said signal being able, when within the overlapping portion of the operating frequency range, to pass through a coupled path formed of the electrical path through a coupled-line of the first quadrature coupler, the first phase shifter, the first amplifier, a coupled line of the second quadrature coupler to the first output port of the second coupler.

2. A system as claimed in claim 1 wherein the coupled passband of said first quadrature coupler is generally the same as that of said second quadrature coupler.

3. A system as claimed in claim 2, wherein the passband of the amplifiers exceeds that of the couplers and the coupled passband of said first and second quadrature couplers coincides with the upper frequency end of the passband of said first and second amplifiers.

4. A system as claimed in claim 2, further comprising a third and a fourth quadrature coupler which have identical operating frequency ranges but which frequency range differs from the operating range of said first and second couplers, all four of said couplers having individually a first and a second input port and a first and a second output port, said first input port of each of said couplers being directly connected to said second output port of each of said couplers by means of first direct through-line through each of said couplers and said second input port of each of said couplers being directly connected to said first output port of each of said couplers by means of a second through-line through each of said couplers, and means for providing the following connections:
  (a) the first output port of the third coupler to the first input port of the first coupler,
  (b) the second output of the third coupler to the second input of the first coupler,
  (c) the first output of the second coupler to the first input of the fourth coupler, and
  (d) The second output of the second coupler to the second input of the fourth coupler and,
said first input port of said third coupler being designated the system input port and said first output port of said forth coupler being designated the system output port.

5. A system as claimed in claim 4, wherein said first and second amplifiers have nearly identical input and output impedances, and said system further comprises a first and a second termination, said first termination being connected between the second input port of the third coupler and ground and the second termination being connected between the second output port of the fourth coupler and ground to absorb reflections from the input ports and the outputs of said amplifiers and present a VSWR at the system input and output ports ports which is improved over that which would be presented directly by the input and output port of said amplifiers.

6. A system is claimed in claim 5 further comprising a negative feed back back circuit connected from the output to the input port to level output variations in the pass band including those generated by all four couplers and their VSWR and coupling interactions.

7. A system as claimed in claim 2 in which the passband of the quadrature couplers are generally the same and the passband of the amplifiers are generally the same and exceed that of the quadrature couplers and said system further comprising an auxiliary system input and an auxiliary output port, a first and a second bandpass filter having a passband within the portion of the passband of the amplifiers that does not coincide with that of the quadrature couplers, said first bandpass filter being connected between said auxiliary input port and the second input port of the first quadrature coupler, and said second bandpass filter being connected between the second output port of said second quadrature coupler and the second auxiliary output port.

8. A system as claimed in claim 7 further comprising a first and a second termination with one terminal of each of said terminations being connected to ground and the other terminal being designated as the termination connection point, and a third and a fourth bandpass filter both of which have a bandpass substantially equal to the pass band of the quadrature couplers, said third bandpass filter being connected between the second input port of the first quadrature coupler and the connection point of the first termination, and said fourth bandpass filter being connected between the second output port of the second quadrature coupler and the connection point of the second termination.

9. A system as claimed in claim 1, wherein said first phase shifter comprises a 180 degree phase reversal plus a transmission line delay and said second phase shifter comprises a transmission delay generally equal to that in said first phase shifter.

10. A system as claimed in claim 9, wherein said first phase shifter is placed in series with the coupled path through the couplers and said second phase shifter is placed in series with the direct through-line path through said couplers.

11. A system as claimed in claim 1, wherein said first and second amplifiers have nearly identical input and nearly identical output impedances, and said system further comprises a first and a second termination, said first termination being connected between the isolated port of the first quadrature coupler and ground and said second termination being connected between the isolated port of said second quadrature coupler and ground to absorb reflections from the input and outputs of said amplifiers and present a VSWR at the system input and output ports which is improved over that which would be presented directly by the input and output ports of said amplifiers.

12. A system as claimed in claim 1 further comprising a through-line within the first quadrature coupler from the second input port to the first output port and a through-line within the second quadrature coupler from the second input port to the first output port, a first and a second termination with each termination being grounded at one terminal and the remaining terminal being considered the terminations connected point, a system input port and a system output port, and a first and second switching means said first switching means being connected to the first and second input ports of the first quadrature coupler, the systems input port, and the connection point of the first termination to make the following connections in a first switching position:

(a) the first input port of the first quadrature coupler to the system input port, and (b) the second input port of the first quadrature coupler to the connection point of the first termination, and to make the following connections in a second switching position:

(c) the first input port of the first quadrature coupler to the connection port of the first termination, and (d) the second input of the first quadrature coupler to the system input port, said second switching means being connected to the first and second output ports of the second quadrature coupler, to the system output port and to the connection point of the second termination to make the following connections in a first switching position:

(e) The first output port of the second quadrature coupler to the system output port, and (f) The second output port of the second quadrature coupler to the connection port of the second termination, and to make the following connections in a second switching position:

(g) The second output port of the second quadrature coupler to the system output port, and (h) The first output port of the second quadrature coupler to the connection point of the second termination.

13. A system as claimed in claim 12, further comprising means for ganging the first switching means and the second switching means to place the first and second switching means in their first switching position simultaneously and to alternatively place them in their second switching position simultaneously.

14. A system as claimed in claim 13, further comprising a switch drive means to simultaneously place the first and second switching means alternatively in their first and second switching positions on the receipt of command signals, and said system further comprising a fault detection means connected to said means for providing connection of said first and second amplifiers to the second quadrature coupler, in order to sense the presence of system signals and generate said command signal for said switch drive means to place said first and second switching means in one of said switching position to pass a system signal through the operating amplifier path in the event of a fault in one of said amplifier paths.

15. A system claimed in claim 14, further comprising means within said fault detection means to accept an input indicating the transmission of a system signal and means for comparing said input with the signals from said connections to the lines connected to said first and second amplifiers to determine the presence of a fault in either amplifier signals paths and to generate a command signal for said switch drive means to actuate said first and second switching means to pass the system signal through the operating amplifier signal path.

16. A system as claimed in claim 1 wherein said first and second quadrature coupler are over coupled and the under coupled arms of the quadrature couplers are used as through-lines, and the ratio of the output voltage of the first amplifier to that of the second amplifier is generally proportional to the ratio of over coupling of said couplers.

* * * * *